US012125533B2

(12) United States Patent
La Rosa et al.

(10) Patent No.: US 12,125,533 B2
(45) Date of Patent: Oct. 22, 2024

(54) NON-VOLATILE MEMORY DEVICE READABLE ONLY A PREDETERMINED NUMBER OF TIMES

(71) Applicants: STMicroelectronics (Rousset) SAS, Rousset (FR); STMicroelectronics International N.V., Geneva (CH)

(72) Inventors: Francesco La Rosa, Rousset (FR); Marco Bildgen, Habere-Poche (FR)

(73) Assignees: STMicroelectronics (Rousset) SAS, Rousett (FR); STMicroelectronics International N. V., Schiphol (NL)

( * ) Notice: Subject to any disclaimer, the term of this patent is extended or adjusted under 35 U.S.C. 154(b) by 119 days.

(21) Appl. No.: 17/812,122

(22) Filed: Jul. 12, 2022

(65) Prior Publication Data
US 2023/0018738 A1   Jan. 19, 2023

(30) Foreign Application Priority Data
Jul. 13, 2021   (FR) ...................... 2107581

(51) Int. Cl.
*G11C 16/04* (2006.01)
*G11C 16/08* (2006.01)
(Continued)

(52) U.S. Cl.
CPC .......... *G11C 16/0433* (2013.01); *G11C 16/08* (2013.01); *G11C 16/10* (2013.01); *G11C 16/26* (2013.01); *H10B 41/35* (2023.02)

(58) Field of Classification Search
CPC ..... G11C 16/0433; G11C 16/08; G11C 16/10; G11C 16/26; H10B 41/35
See application file for complete search history.

(56) References Cited

U.S. PATENT DOCUMENTS 6,867,994 B2 *  3/2005  Tsukikawa ........... H10B 12/482
                                                              365/207
7,535,761 B2 *  5/2009  Park ................... G11C 16/3418
                                                              365/185.11
(Continued)

FOREIGN PATENT DOCUMENTS

FR   2002929 A1   10/1969
FR   3025649      3/2016
(Continued)

OTHER PUBLICATIONS

Gassend B. L. P., "Physical Random Functions Thesis" Thesis at the Massachusetts Institute of Technology, Feb. 1, 2003, 89 Pages.

*Primary Examiner* — Vanthu Nguyen
(74) *Attorney, Agent, or Firm* — Slater Matsil, LLP

(57) ABSTRACT

In an embodiment a non-volatile memory device includes a memory plane including at least one memory area including an array of memory cells having two rows and N columns, wherein each memory cell comprises a state transistor having a control gate and a floating gate selectable by a vertical selection transistor buried in a substrate and including a buried selection gate, and wherein each column of memory cells includes a pair of twin memory cells, two selection transistors of the pair of twin memory cells having a common selection gate and a processing device configured to store in the memory area information including a succession of N bits so that, with exception of the last bit of the succession, a current bit of the succession is stored in two memory cells located on the same row and on two adjacent columns and a current bit and the following bit are respectively stored in two twin cells.

20 Claims, 17 Drawing Sheets

(51) Int. Cl.
    *G11C 16/10*     (2006.01)
    *G11C 16/26*     (2006.01)
    *H10B 41/35*     (2023.01)

(56) References Cited

U.S. PATENT DOCUMENTS

| | | | |
|---|---|---|---|
| 9,368,215 B2 * | 6/2016 | La Rosa | G11C 16/0408 |
| 9,825,186 B2 * | 11/2017 | La Rosa | H01L 29/788 |
| 10,438,960 B2 | 10/2019 | La Rosa et al. | |
| 2008/0256600 A1 | 10/2008 | Schrijen et al. | |
| 2013/0228846 A1 | 9/2013 | La Rosa et al. | |
| 2021/0303735 A1 | 9/2021 | La Rosa | |

FOREIGN PATENT DOCUMENTS

| | | | |
|---|---|---|---|
| FR | 3049380 A1 | 9/2017 | |
| FR | 3059458 A1 | 6/2018 | |
| FR | 3108782 A1 | 10/2021 | |

* cited by examiner

[Fig 1]
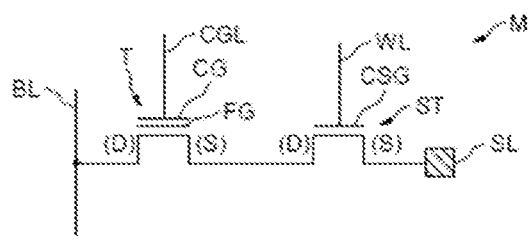
[Fig 2]
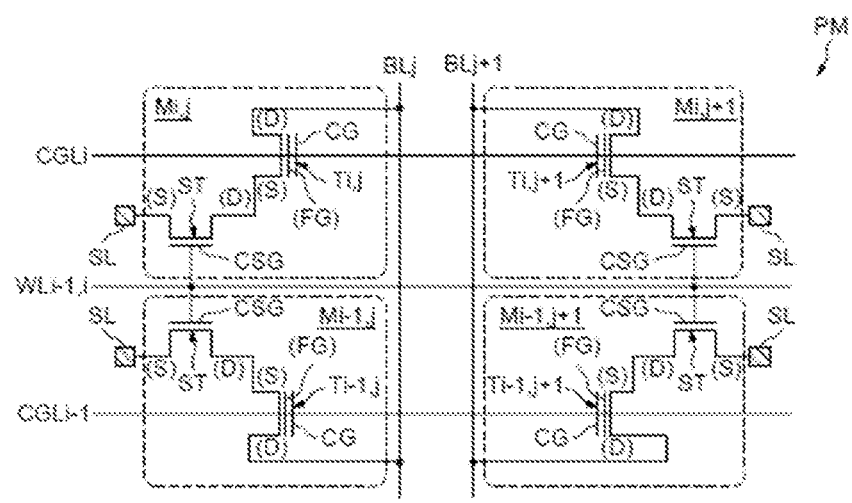

[Fig 3]
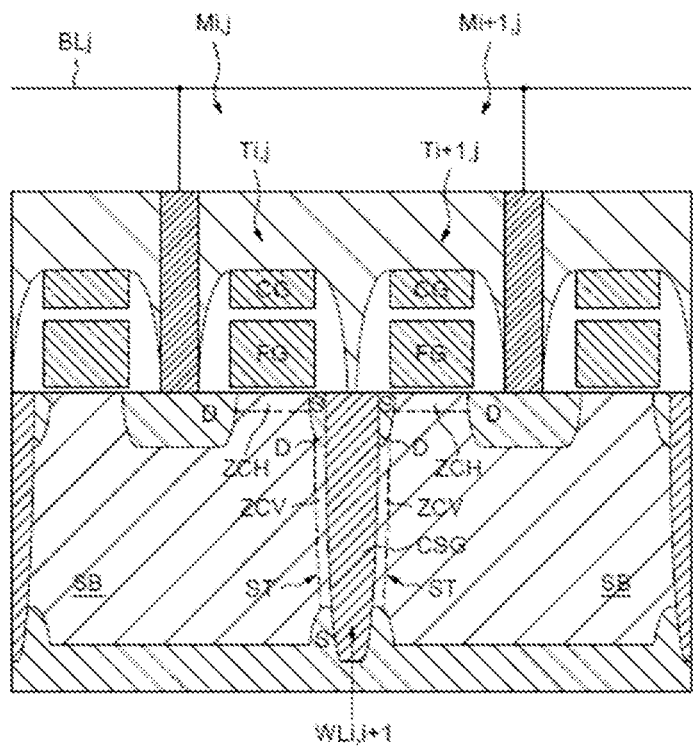
[Fig 4]
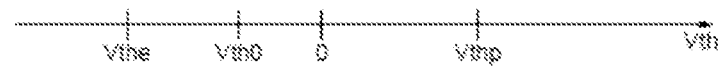

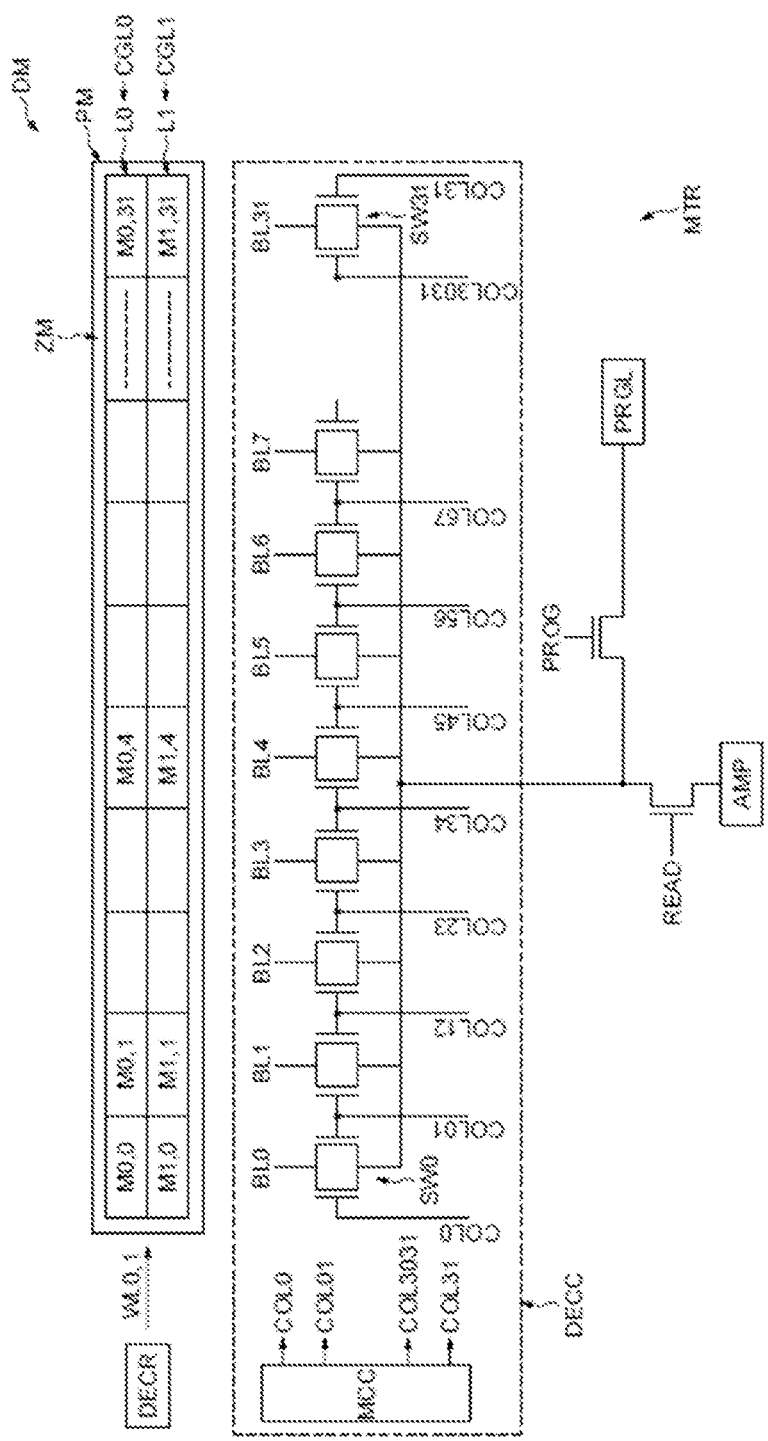

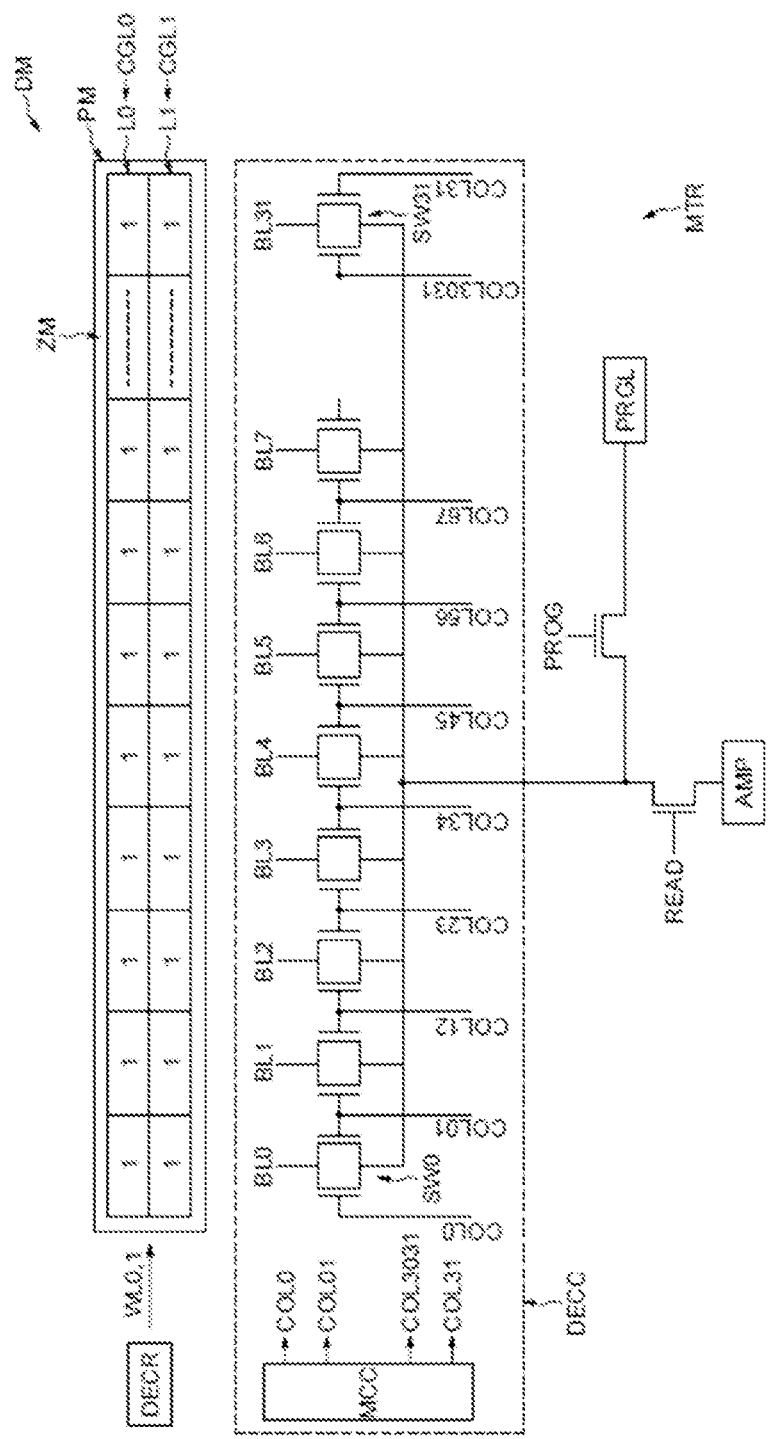
[Fig 6]

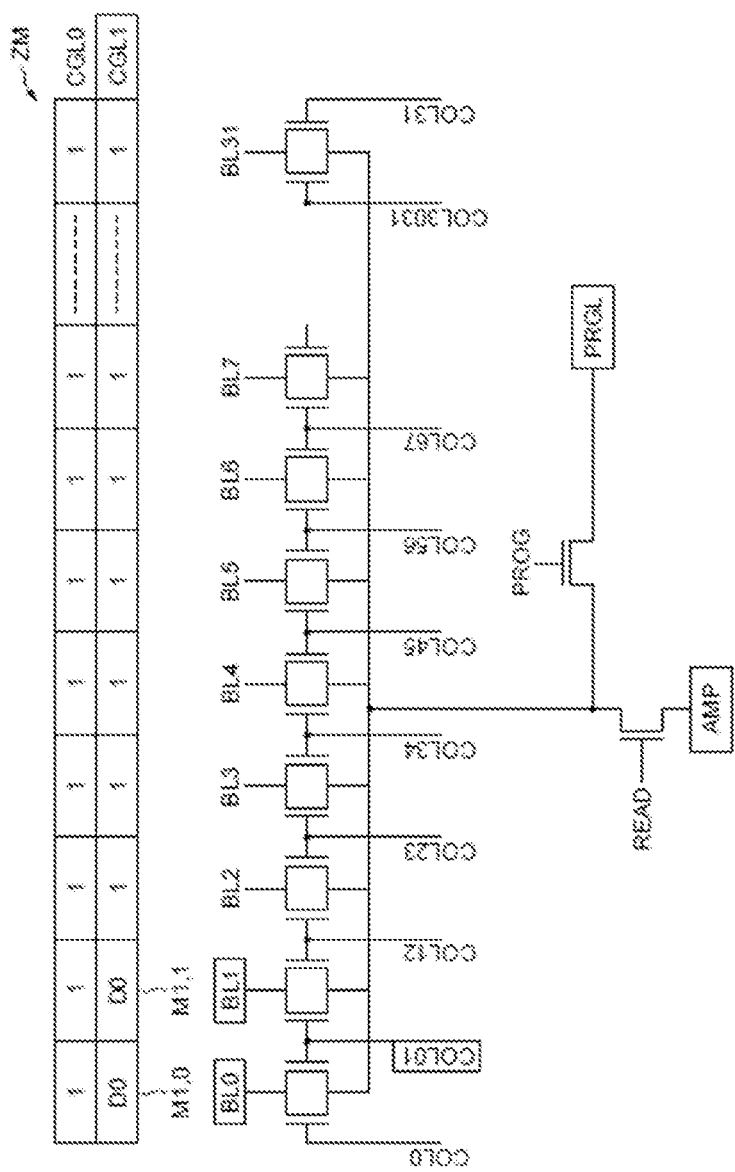
[Fig 7]

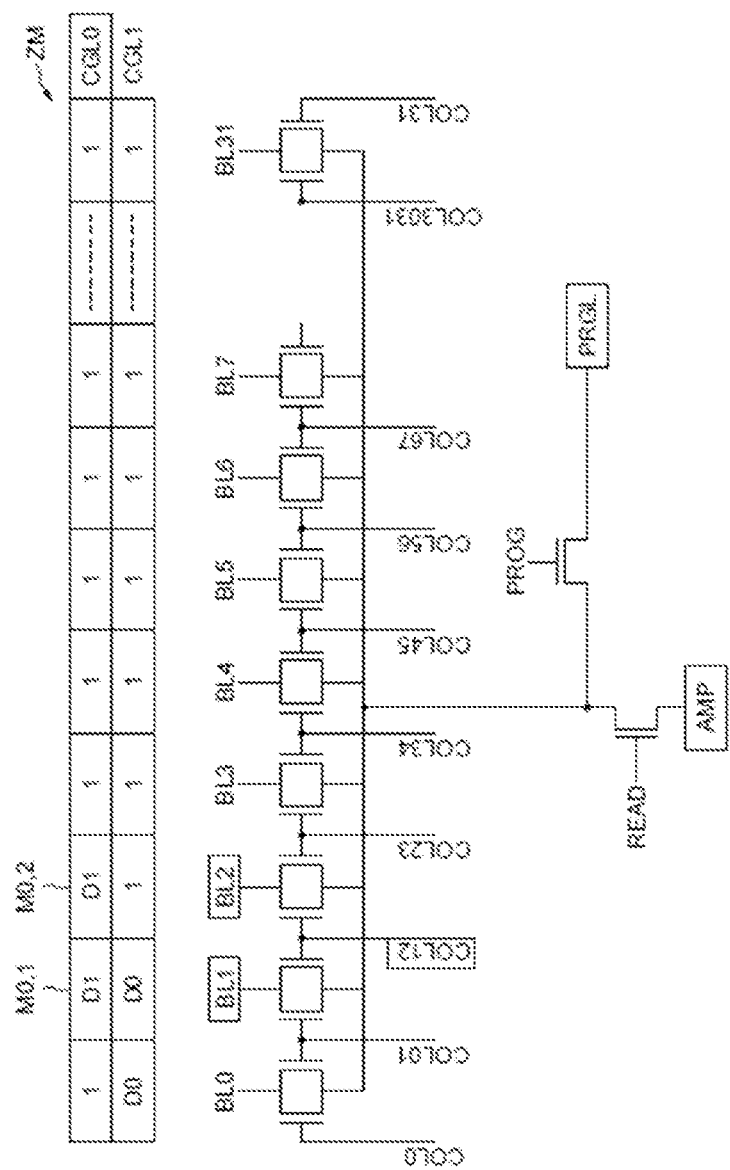

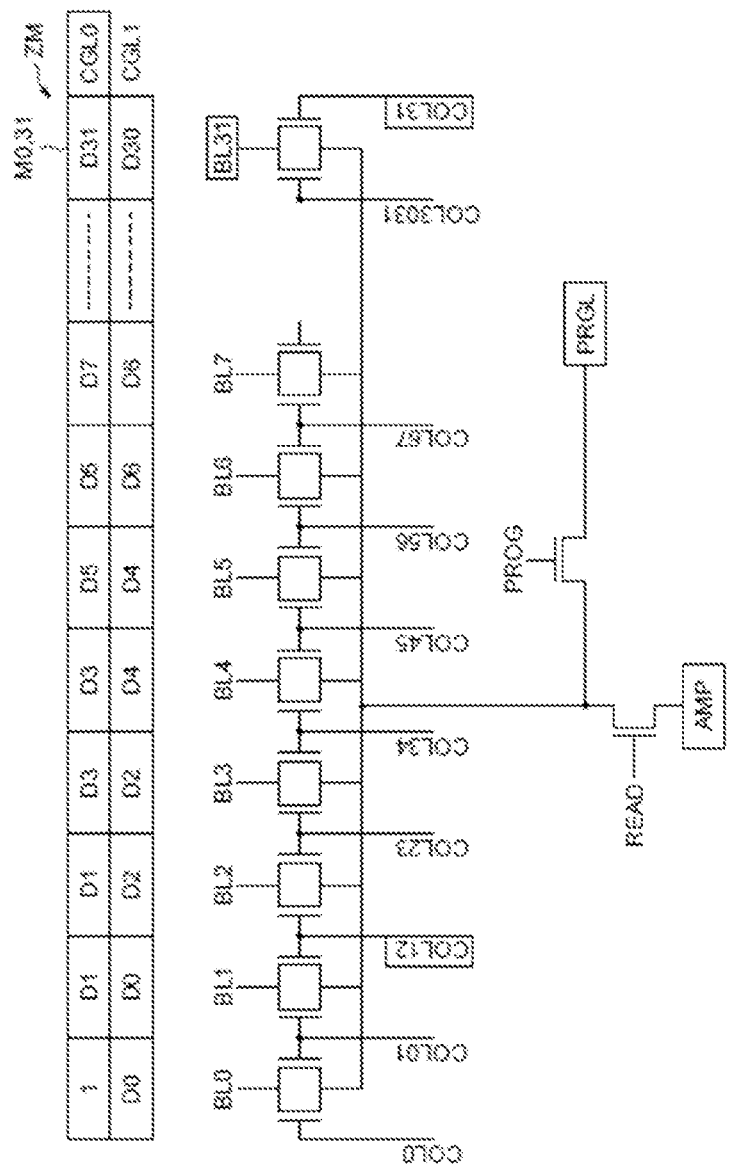
[Fig 9]

[Fig 10]

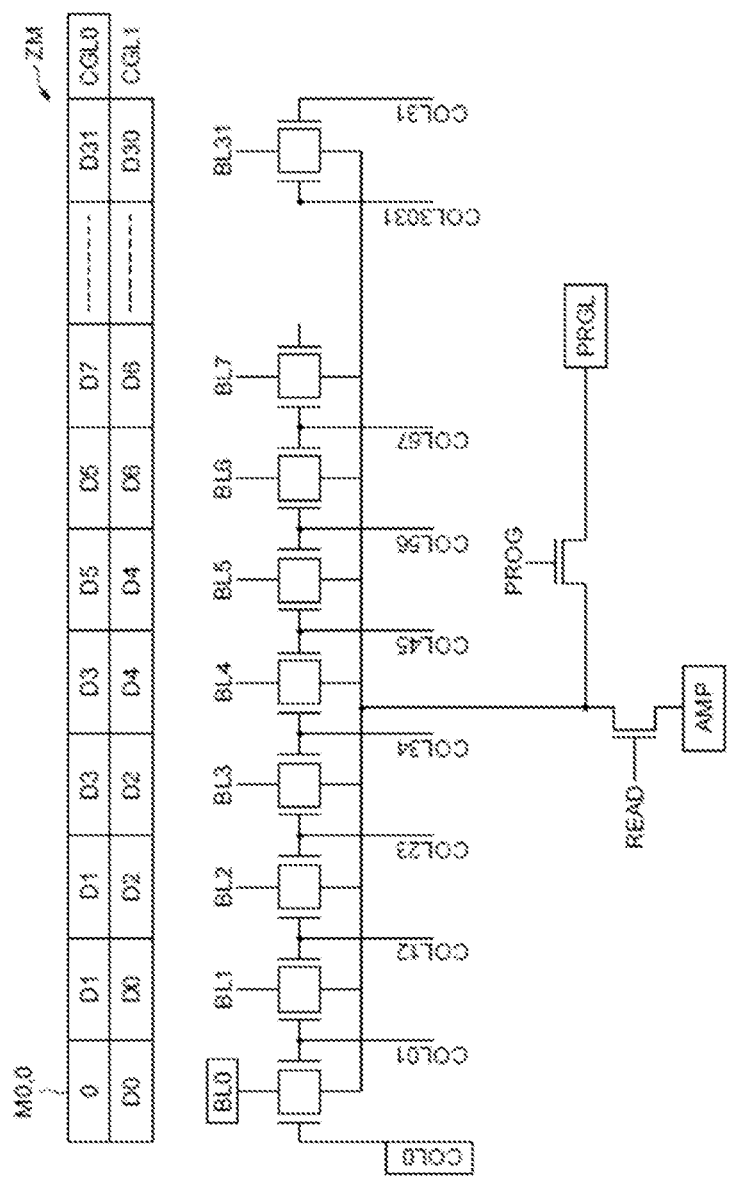
[Fig 11]

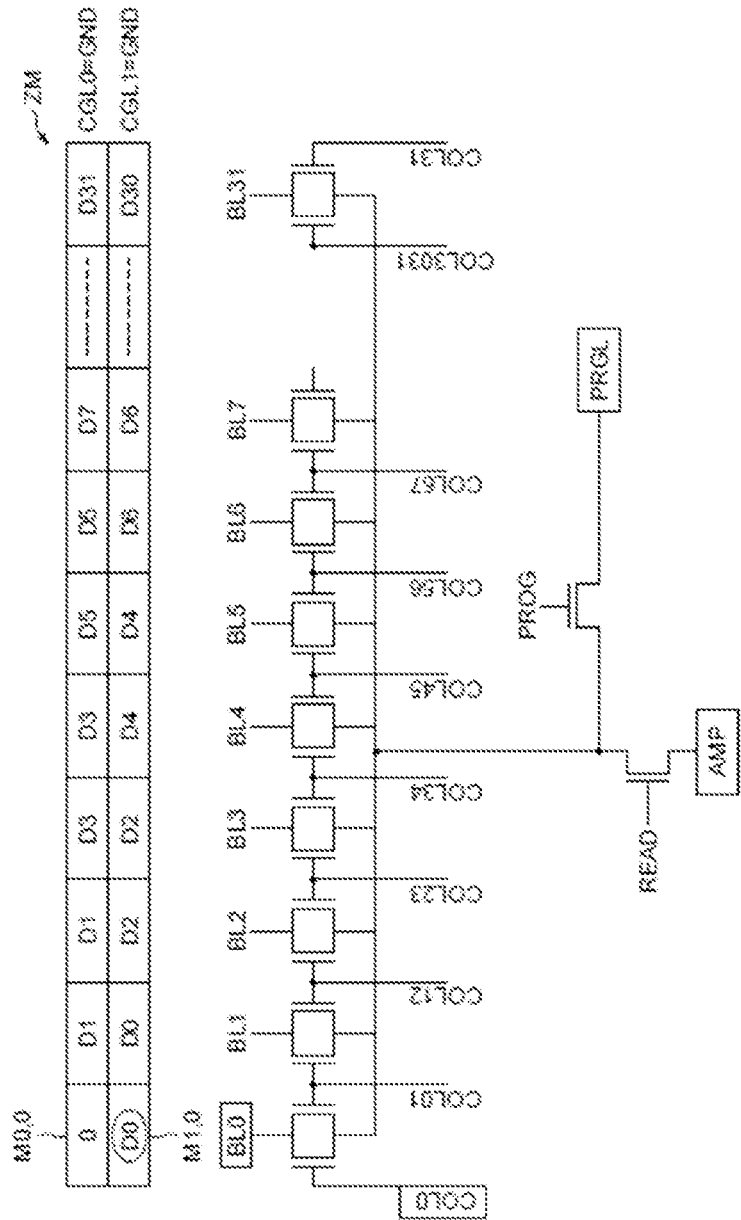
[Fig 12]

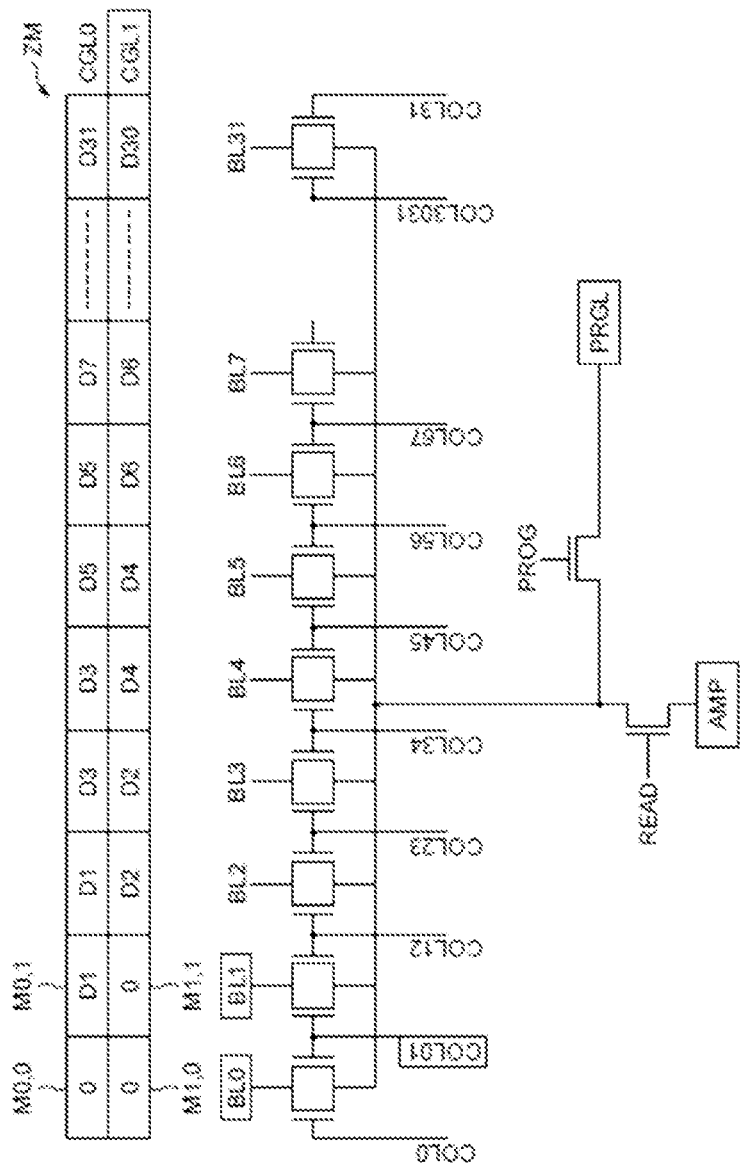
[Fig 13]

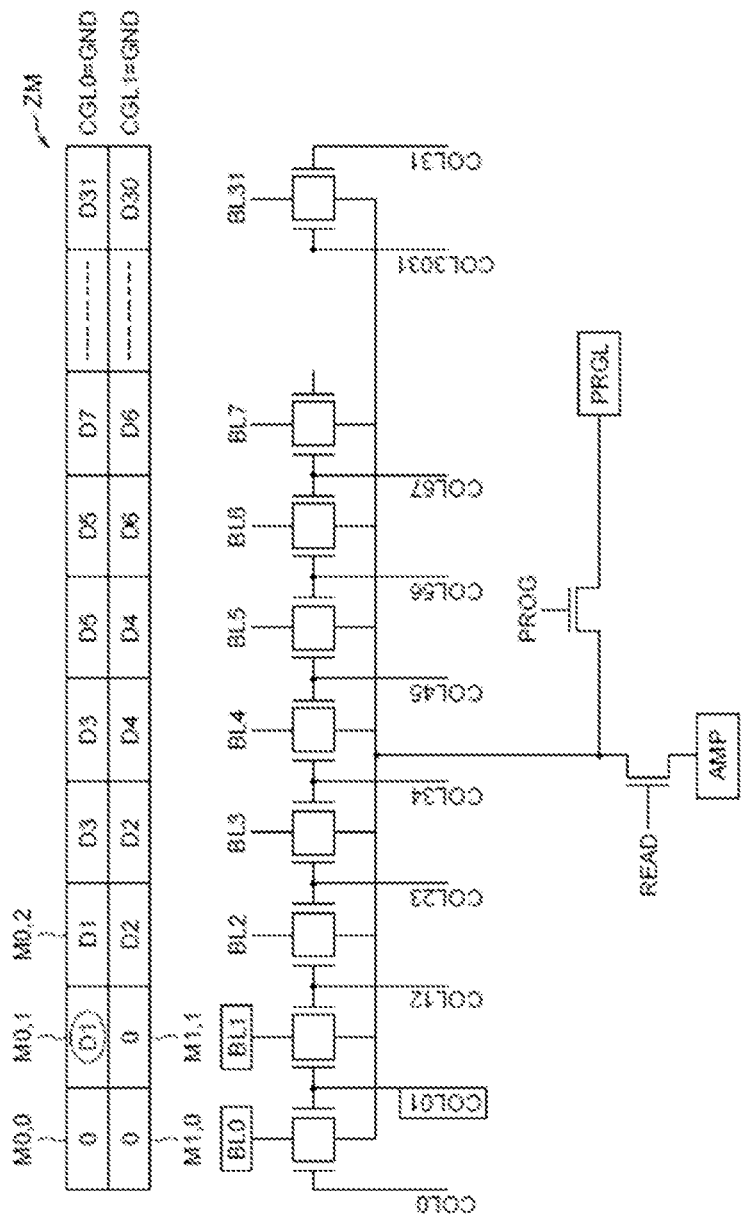
[Fig 14]

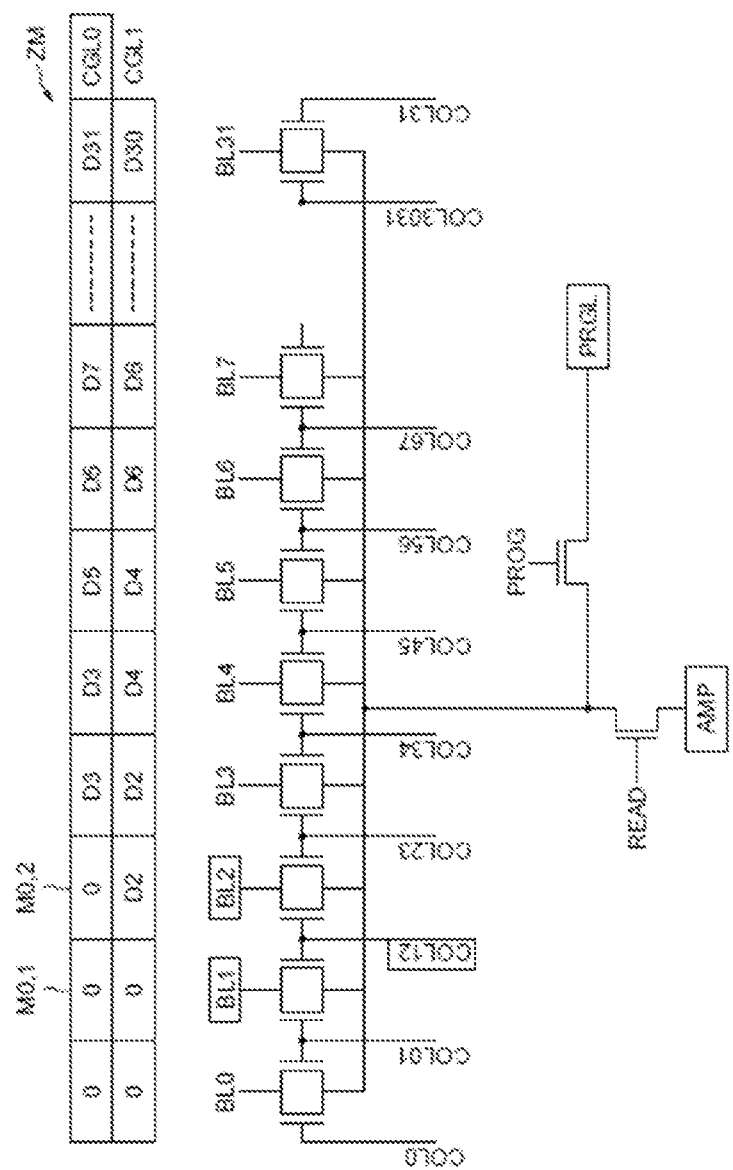
[Fig 15]

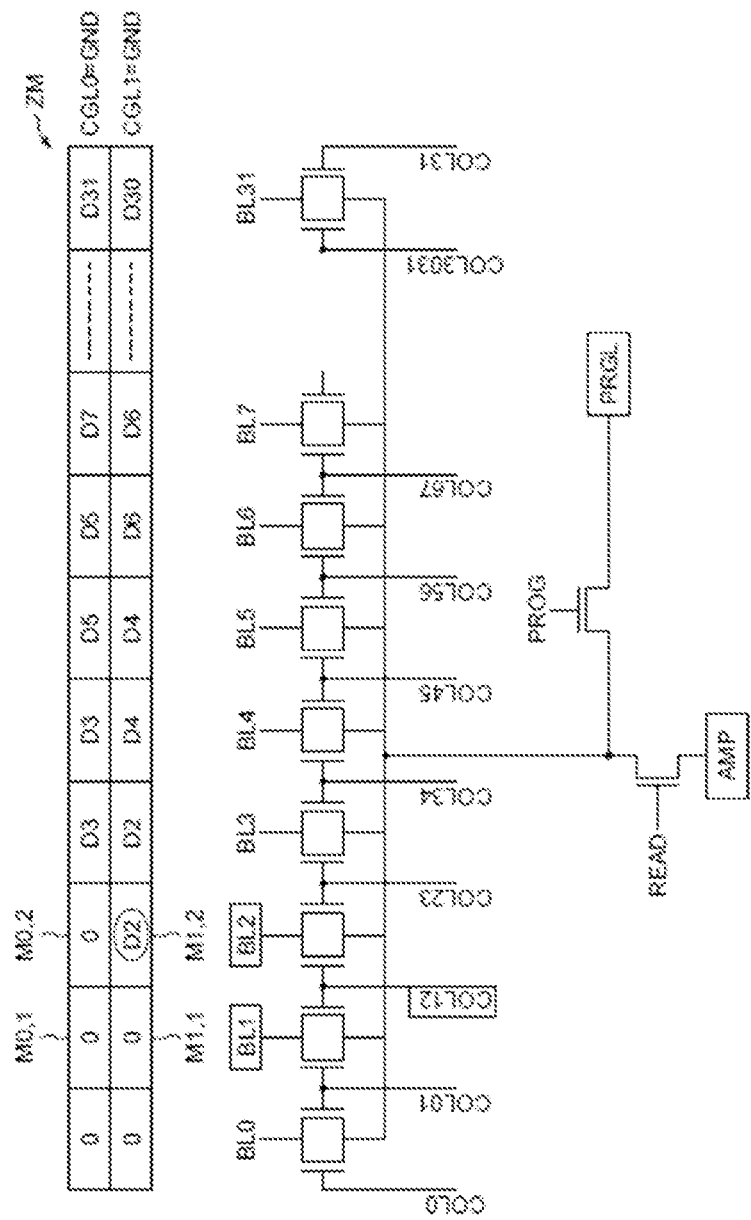
[Fig 16]

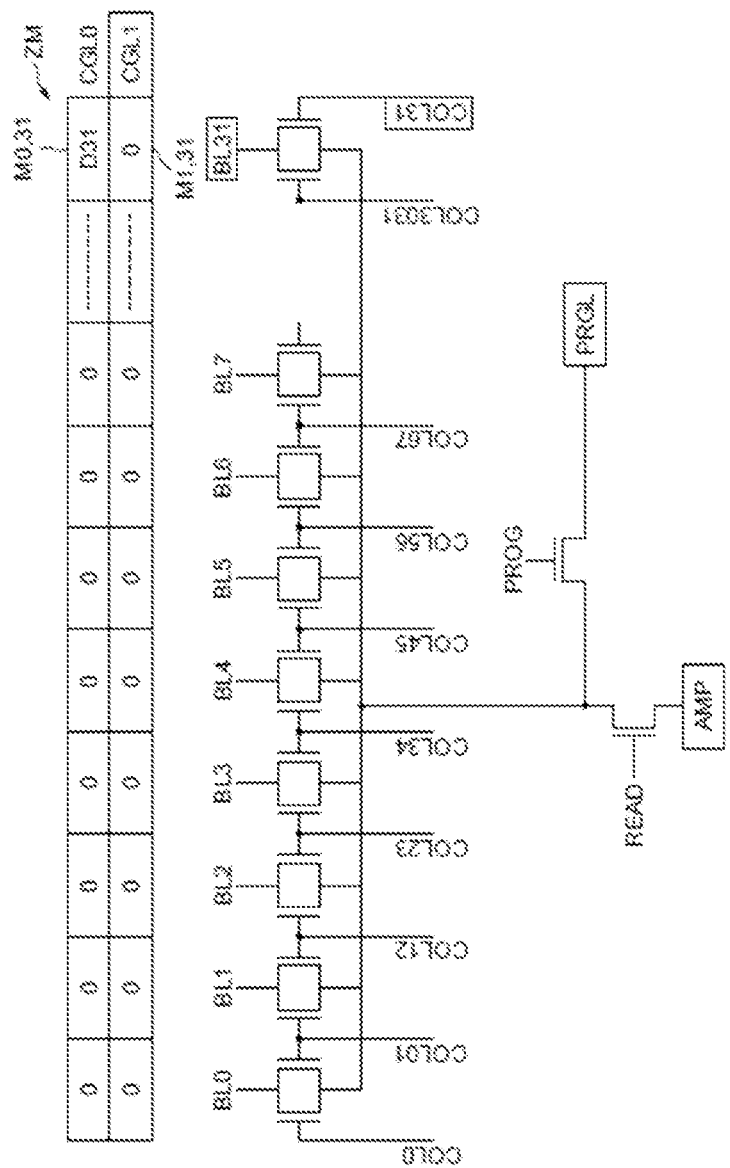
[Fig 17]

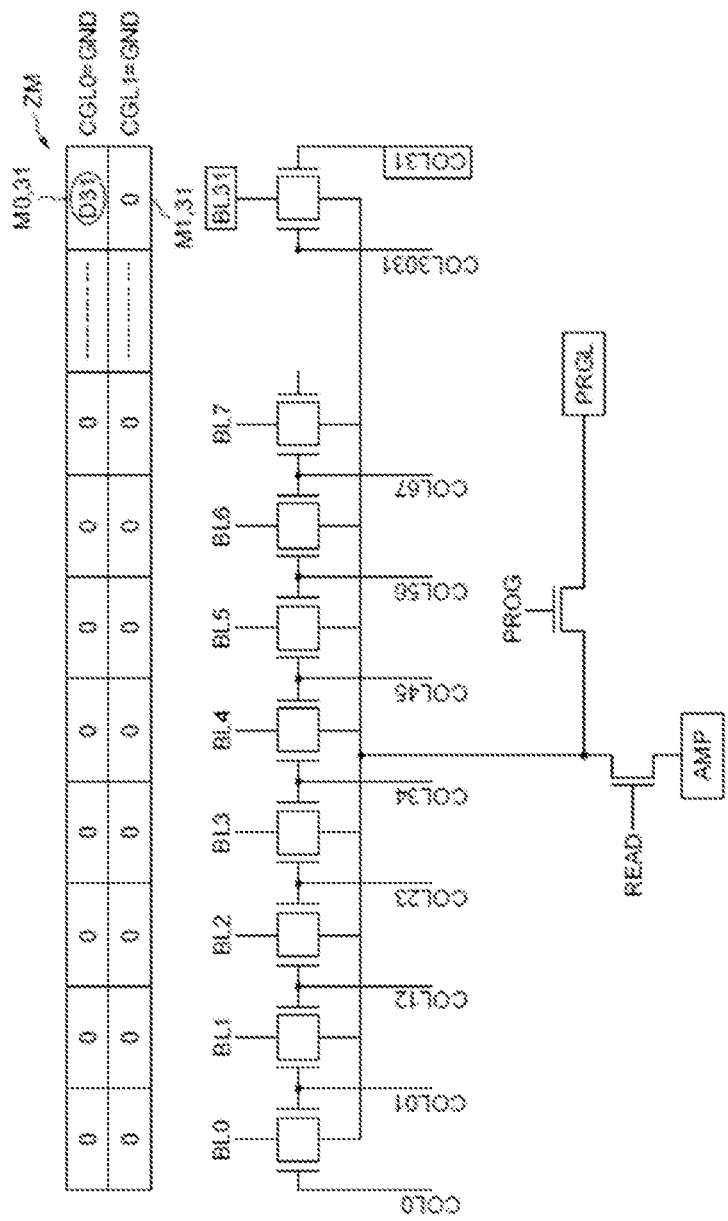
[Fig 18]

[Fig 19]
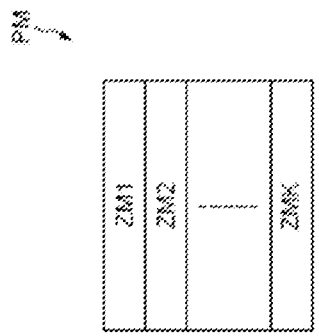

NON-VOLATILE MEMORY DEVICE READABLE ONLY A PREDETERMINED NUMBER OF TIMES

CROSS-REFERENCE TO RELATED APPLICATIONS

This application claims the priority of French Patent Application No. 2107581, filed on Jul. 13, 2021, which application is hereby incorporated herein by reference.

TECHNICAL FIELD

The disclosure relate to non-volatile memories, and in particular memories readable only once or a predefined number of times.

BACKGROUND

There is a need to propose a non-volatile memory structure capable of storing information of a plurality of bits in a manner rendering difficult or even impossible the restoration of the correct value of the stored information by using a conventional memory reading method.

There is also a need to propose such a memory structure that may be read only once, or at least only a predefined number of times, so as to prevent for example numerous repetitive readings of the memory by an ill-intentioned third party in the aim of using the stored data a significant number of times to carry out fraudulent actions.

SUMMARY

Embodiments provide a non-volatile memory device comprising a memory plane including at least one memory area including an array of memory cells having two rows and N columns.

Each memory cell comprises a state transistor having a control gate and a floating gate, selectable by a vertical selection transistor buried in a substrate and including a buried selection gate.

Each column of memory cells includes a pair of twin memory cells.

Two memory cells are referred to as twin when the two selection transistors of this pair of memory cells have a common selection gate.

The memory device also comprises processing means configured to store in the memory area, information including a succession of N bits.

This information of N bits, may include a data useful for storing N bits, for example a key, or a data useful for storing M bits, with M lower than N, and N-M dummy bits having for example a predefined value.

The storage of said information is advantageously carried out so that, with the exception of the last bit of the succession,
  a current bit of said succession of bits is stored in two memory cells located on the same row and on two adjacent columns, and
  a current bit and the following bit are respectively stored in two twin cells.

Such a twin-cell structure combined with this filling of the chequered type of the memory area and a redundant storage of the current bit in two memory cells, leads to a robust storage of the information and renders difficult the restoration of the correct value of bits of the information, in particular with a conventional method for reading these memory cells.

In this regard, in order to ensure correct reading of a bit, the processing means are advantageously configured to, in order to be able to read a bit stored in a first twin cell, replace beforehand the bit stored in the second twin cell with a reference bit having a reference value chosen to make possible a correct restoration of the value of the bit stored in the first twin cell. This reference value is for example the logic value 0 corresponding to a programmed state of the twin memory cell.

Indeed since the two twin cells are selected simultaneously, the value of the bit stored in the second twin cell should not optionally "mask" (for example if this value is equal to 1) the value of the bit stored in the first twin cell.

Moreover the processing means are further advantageously configured to sequentially read the N bits of the information and, for each bit of the succession with the exception of the last, replace an already read current bit of said information with the reference bit, before being able to read the following bit of said succession.

Such a reading with replacement of each already read bit with the reference bit, before being able to read the following bit of the information, amounts to "destroying" the bits as they are read, with the exception of the last, and therefore render impossible a new restoration of the stored information.

The memory area and therefore the memory device may therefore only be read once to only deliver the stored information once.

Of course, according to one embodiment, it is possible that the memory device comprises a plurality of memory areas intended to contain the same information of N bits, and the processing means are then configured to successively read the various memory areas.

Thus, with this embodiment it becomes possible to read the stored information as many times as there are memory areas.

This number of memory areas depends of course on the application envisaged for the use of the memory device.

According to one embodiment, the memory area includes one single bit line per column connected to the drains of the state transistors of the pair of twin cells of the corresponding column, and one gate control line, per row of memory cells, connected to all of the control gates of the state transistors of the memory cells of the corresponding row.

According to one embodiment, the processing means comprise a column decoder configured to individually select the two bit lines associated with the two columns located at the two ends of the memory area and, to simultaneously select two adjacent bits, for the operation of storing the information as well as for the operation of reading and of replacing beforehand the bits.

Such a non-limiting example of column decoder makes it possible to implement the particular storage and reading mentioned above.

Each memory cell has a first state, for example an erased state, wherein it stores a bit having a first logic value, for example the logic value 1, and a second state, for example a programmed state, wherein it stores a bit having a second logic value, for example the logic value 0, and the reference bit (which replaces an already read bit to make it possible to read the following bit), advantageously has the second logic value.

The state transistor of a memory cell is advantageously configured to be normally on when the memory cell is in its first state and to be turned off when the memory cell is in its second state.

A simple way of obtaining such a state transistor is to provide a state transistor of the depletion type.

Moreover, according to one embodiment, the state transistor has, in the first state of the memory cell, a negative threshold voltage and lower than the threshold voltage of the state transistor of the memory cell at the virgin state whereas in the second state of the memory cell, the threshold voltage of the state transistor is positive and higher than the threshold voltage of the state transistor of the memory cell at the virgin state.

Although this is not essential, it is particularly interesting that the channel of the state transistor of each memory cell comprises a channel implanted at the surface in the substrate and configured so that the memory cell operates in a depletion mode.

Indeed, this will make it possible for example to apply a zero voltage on the control gate during reading.

Indeed, the state transistor being of the deletion type, the normally on character of the state transistor when the memory cell is in a virgin state and that a zero voltage is applied on the control gate, is related to the value of its threshold voltage in the virgin state of the memory cell that may for example be chosen negative or substantially zero.

In addition, the threshold voltages of the state transistor in the two states (erased and programmed) of the memory cell are located on either side of the threshold voltage of the state transistor of the memory cell at the virgin state.

Therefore, it becomes possible to configure the processing means so that they apply a zero read voltage on the control gate of the state transistor of a memory cell during an operation of reading this memory cell.

Indeed, with such a zero read voltage, it is possible to differentiate the state of the memory cell since the state transistor of a memory cell in its first state (erased cell for example) will be normally on since its threshold voltage will be lower than that of a virgin cell and it will be turned off in the presence of a memory cell in its second state (programmed cell for example) since the threshold voltage this time will be positive.

When the first state of a memory cell corresponds to an erased state of the cell and the first logic value is a 1, and that the second state of a memory cell corresponds to a programmed state of the cell and the second logic value is a 0, and the processing means are configured to, in order to replace an already read bit, programme the two memory cells containing this already read bit.

It is particularly advantageous that before storing the information in the memory area, all of the memory cells of the memory area are in an erased state.

Indeed in this case, it is simply sufficient to programme the memory cells before storing a logic zero.

Further embodiments provide a method comprising storing information including a succession of N bits in a non-volatile memory device.

The device comprises a memory plane including at least one memory area including an array of memory cells having two rows and N columns, each memory cell comprising a state transistor having a control gate and a floating gate, selectable by a vertical selection transistor buried in a substrate and including a buried selection gate, each column of memory cells including a pair of twin memory cells, the two selection transistors of a pair of twin memory cells having a common selection gate.

The storage of N bits is carried out so that with the exception of the last bit of the succession, a current bit of said succession of bits is stored in two memory cells located on the same row and on two adjacent columns and that a current bit and the following bit are respectively stored in two twin cells.

According to one embodiment, the method comprises, in order to be able to read a bit stored in a first twin cell, replacing beforehand the bit stored in the second twin cell with a reference bit having a reference value chosen to make possible a correct restoration of the value of the bit stored in the first twin cell.

According to one embodiment, the method further comprises sequentially reading the N bits and for each bit of the succession with the exception of the last, replacing an already read current bit with the reference bit, before being able to read the following bit of said succession.

According to one embodiment, the method comprises applying a zero read voltage on the control gate of the state transistor of a memory cell during an operation of reading this memory cell.

According to one embodiment, the method comprises individually selecting the two bit lines associated with the two columns located at the two ends of the memory area and simultaneously selecting two adjacent bits, for the operation of storing the information as well as for the operation of reading and of replacing beforehand the bits.

According to one embodiment, wherein each memory cell possesses a first state corresponding to an erased state of the cell wherein it stores a logic 1, and a second state corresponding to a programmed state of the cell wherein it stores a logic 0, the method comprises, in order to replace an already read bit, programming two memory cells containing this already read bit.

According to one embodiment, the method comprises before storing the information in the memory area, erasing all of the memory cells of the memory area.

According to one embodiment, the method comprises storing said information in a plurality of memory areas, and successively reading the various memory areas.

BRIEF DESCRIPTION OF THE DRAWINGS

Other advantages and features of the invention will become apparent upon examination of the detailed description of non-limiting implementations and embodiments, and of the appended drawings, wherein:

FIG. 1 shows a non-volatile memory cell of the split gate type;

FIG. 2 shows a memory plane structure with memory cells and one single bit line per column;

FIG. 3 illustrates two twin cells belonging to the same column and to the two lines;

FIG. 4 shows schematically various threshold voltages respectively corresponding, for example, to erased, virgin and programmed memory cells;

FIG. 5 shows a column decoder individually selects two bit lines associated with two columns located at the two ends of the memory area;

FIG. 6 shows that all of the memory cells of the memory area are in an erased state before storing information in the memory area;

FIG. 7 shows that the column decoder selects the two bit lines with aid of a logic signal;

FIG. 8 illustrates that the column decoder selects the two bit lines with aid of another logic signal;

FIG. 9 shows that a write operation is carried out by selecting the bit line and by selecting the gate control line;

FIG. 10 shows that a chequered filling of the memory area is obtained at the end of the write operation;

FIG. 11 illustrates that the value stored in a twin cell is replaced with a reference bit before the memory cell is read;

FIG. 12 illustrates that the two twin cells are read;

FIG. 13 illustrates that a correct restoration of a logic value of a data can be obtained;

FIG. 14 illustrates that two bit lines are selected;

FIG. 15 illustrates that the cell is programmed prior to reading;

FIG. 16 illustrates that the cell is read;

FIG. 17 illustrates that the twin cell is programmed;

FIG. 18 illustrates that the twin cell is read; and

FIG. 19 illustrates a memory plane PM including K areas.

DETAILED DESCRIPTION OF ILLUSTRATIVE EMBODIMENTS

In FIG. 1, the reference M designates a non-volatile memory cell of the split gate type, for example of the selection transistor type having a vertical gate buried in the substrate of an integrated circuit.

More specifically, the memory cell M includes a state transistor T including a floating gate FG topped by a control gate CG connected to a gate control line CGL.

The drain (D) of the state transistor T is connected to a bit line BL whereas the source (S) of the state transistor T is connected to the drain of a selection transistor ST.

The selection transistor ST includes a gate CSG connected to a word line WL.

The source (S) of the selection transistor ST is connected to a source line SL.

By way of example, FIG. 2 shows a memory plane PM structure with one single bit line per column and comprising memory cells Mi,j; Mi,j+1; Mi−1,j; Mi−1,j+1 of the type described in the patent application US 2013/0228846.

The memory cells Mi,j and Mi,j+1 of rank "i" belong to the line or row of rank i of the memory plane and are connected to a word line WLi−1,i and to a gate control line CGLi.

The memory cells Mi−1,j and Mi−1,j+1 of rank "i−1" belong to the line or row of rank "i−1" of the memory plane and are connected to the word line and to a gate control line CGLi−1.

The memory cells Mi,j and Mi−1,j of rank "j" belonging to the column j are read and write accessible by means of a single bit line BLj and the memory cells Mi,j+1 and Mi−1,j+1 of rank "j−1" are read and write accessible by means of a single bit line BLj+1.

Each memory cell includes a floating gate FG transistor, respectively Ti,j; Ti,j+1, Ti−1,j; Ti−1,j+1. The drain (D) regions of transistors Ti,j and Ti−1,j are connected to the bit line BLj and the drain terminals of transistors Ti,j+1 and Ti−1,j+1 are connected to the bit line BLj+1. The control gates CG of transistors Ti,j and Ti,j+1 are connected to the gate control line CGLi and the control gates CG of floating gate transistors Ti−1,j and Ti−1,j+1 are connected to the gate control line CGLi−1.

Each floating gate transistor has its source (S) terminal connected to a source line SL by means of the selection transistor ST. The selection transistors ST of memory cells Mi,j and Mi−1,j have a common selection gate CSG and the two memory cells are, therefore, referred to as "twin".

Likewise, memory cells Mi,j+1 and Mi−1,j+1 are twin memory cells and their selection transistors ST have a common selection gate CSG.

Each selection gate CSG is a vertical gate buried in a substrate wherein the memory plane PM is produced, the source line SL also being buried. These common selection gates CSG of twin memory cells, are connected to the word line WLi−1,i.

As illustrated in FIG. 3, and as indicated above, each state transistor of the memory device of FIG. 2 cooperates with a vertical selection transistor buried in the substrate SB.

The channel ZCH of the state transistor is referenced ZCH.

The selection transistors ST connected to the two state transistors Ti,j and Ti+1,j each have a vertical channel ZCV and a buried vertical common selection gate CSG. It should be noted that for purposes of simplification of the figure, the contact for connecting the buried common gate CSG to the corresponding word line WLi,i+1, is not shown.

FIG. 3 more specifically illustrates two twin cells Mi,j and Mi+1,j belonging to the same column j and to the two lines i and i+1.

Their drain is connected to the same bit line BLj that is the only bit line for the column j.

Each memory cell has a first state, for example an erased state, wherein it stores a bit having a first logic value, for example the logic value 1, and a second state, for example a programmed state, wherein it stores a bit having a second logic value, for example the logic value 0.

The state transistor of a memory cell is advantageously configured to be normally on when the memory cell is in its first state and to be turned off when the memory cell is in its second state.

A simple way of obtaining such a state transistor is to provide for example a state transistor of the depletion type as described in the French patent application published under the no. 3049380.

As is well known to the person skilled in the art, the depletion-mode MOS transistor is normally on without control voltage applied on the control gate of the state transistor (control gate connected to the ground), and consequently on the floating gate by capacitive coupling. The state transistor is therefore referred to as "normally on". On the other hand, the transistor becomes less and less conducting as the control voltage present on the control gate increases in absolute value (becomes more and more negative) to finally turn off beyond a blocking voltage.

The channel ZCH of the state transistor is advantageously a surface channel so that it is able to block the conduction of the channel by application of an acceptable control voltage on the control gate of the state transistor.

The energy of implantation of the dopants defines the depth of the channel ZCH. By way of example, this energy may be between 5 keV and 100 keV then leading to a channel depth in the order of 100 nm.

In the case of a channel of the N type of conductivity, the implanted dopants may for example be arsenic As, and the concentration of dopants determines the threshold voltage Vtho of the state transistor of a memory cell in the virgin state. Here, the state transistor is configured to have such a negative threshold voltage Vtho. In this regard, a dose of implanted dopants between 1012 atoms/cm$^2$ and 10$^{14}$ atoms/cm$^3$ may be used.

With such a dose of dopants, a negative voltage Vtho for example between −1 Volt and −0.5 Volt can be obtained.

FIG. 4 shows schematically the various threshold voltages Vthe, Vtho and Vthp respectively corresponding for example to erased, virgin and programmed memory cells.

In read mode, a zero read voltage can be applied on the control gate CG of the state transistor and a positive voltage can be applied on the bit line BL.

As the state transistor is in depletion mode with a negative voltage Vtho, it is normally on for a virgin memory cell, that is to say when no charge is present in the floating gate.

FIG. 4 therefore highlights that a state transistor of an erased memory cell will be normally on whereas the state transistor of a programmed memory cell will be turned off. In addition, the fact of applying a zero voltage on the control gate and consequently on the floating gate FG of the state transistor, does not induce read stress.

Moreover, the programming or the erasing of a floating gate transistor is carried out here by the injection or the extraction of electrical charges in the gate of the transistor by injection of hot electrons by means of high voltage(s).

More particularly, the erasing of a memory cell is ensured by combining a positive voltage applied to the substrate with a negative voltage applied to the control gate of its floating gate state transistor.

As regards the twin cell, if it is only desired that it is simultaneously erased, a positive voltage is applied on the control gate of its state transistor.

The programming of a memory cell may be ensured for example by applying a positive voltage to the bit line concerned, by applying a zero voltage to the substrate, and a positive voltage on the control gate of its floating gate state transistor.

The selection of such a memory cell to be programmed is carried out by applying a positive voltage higher than the threshold voltage of the state transistor, on the word line concerned.

As regards the twin cell, if it is only desired that it is simultaneously programmed, a fairly negative voltage, for example −0.5 Volt or −1 Volt, or zero is applied on the control gate of its state transistor.

Finally, as indicated above, the reading of a memory cell is ensured by applying a zero voltage to the control gate CG of its state transistor, as well as a positive voltage to the corresponding bit line.

The selection of such a memory cell to be read is carried out by applying a positive voltage higher than the threshold voltage of the state transistor, on the word line concerned.

In practice, a zero voltage will be applied in read mode on all of the cells of the memory plane.

Therefore, two selected twin cells will be read simultaneously.

In addition, if the column decoder is also configured, as will be seen in more detail hereafter, to simultaneously select two adjacent bit lines, the two corresponding pairs of twin cells will be read simultaneously.

Reference is now made more particularly to FIG. 5 and following to describe more specifically embodiments.

In FIG. 5, the reference DM designates a memory device including a memory plane PM including a memory area ZM.

Here, this memory area ZM contains an array of memory cells Mi,j having two rows or lines L0 and L1 and N columns, here 32 columns.

The memory cells Mi,j are memory cells such as those described with reference to the preceding figures.

In this example, i designates the row or line index and i equals 0 or 1.

The index j designates the column index and varies from 0 to 31 in this example.

The memory area ZM is intended to store information including N binary data D0-D31.

The memory device DM also includes processing means MTR including particularly a line decoder DECR, of conventional structure, and configured to deliver voltages on the word line WL0,1 as well as on the gate control lines CGL0 and CGL1.

The processing means also include a column decoder DECC.

This column decoder DECC includes here a set of switches SW0-SW31 each including two MOS transistors in parallel.

A first terminal of the switch SWj is connected to the corresponding bit line BLj.

A second terminal of the switch SWJ is connected either to a read amplifier AMP circuit by means of a MOS transistor controlled on its gate by a read signal or with a programming means PRGL, of conventional structure, by means of another MOS transistor controlled on its gate by a programming PROG control signal.

These READ and PROG signals are delivered by the processing means MTR depending on whether we are in a read phase or in a programming phase.

As illustrated in FIG. 5, the column decoder DECC is configured to individually select the two bit lines BL0 and BL31 associated with the two columns located at the two ends of the memory area ZM, by means of logic signals COL0 and COL31.

Moreover, the column decoder is also configured to simultaneously select two adjacent bit lines BLj and BLj+1 by the logic signal COLjj+1.

This individual selection of two bit lines BL0 and BL31 and the simultaneous selection of two adjacent bit lines is carried out for the operation of storing information D0-D31 in the memory cells of the memory area ZM as well as for the read operation that, as will be seen in more detail hereafter, includes replacing beforehand bits with a reference bit, in this instance a bit of logic value 0.

The logic signals COL0, COL31 and COLjj+1 are delivered by logic means MCC.

As indicated above, the memory area is intended to store 32 data bits D0-D31.

In addition, as illustrated in FIG. 6, before storing this information in the memory area ZM, all of the memory cells of the memory area ZM are in an erased state, that is to say they all contain the logic value 1.

Figure 10:
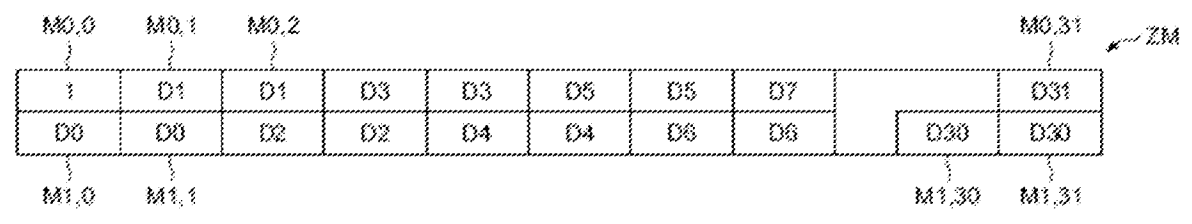

Reference is now made more particularly to FIGS. 7 to 10 to illustrate the successive writing of N bits D0-D31 of the information in the memory area ZM.

Generally, since the initial state of the memory cells of the memory area ZM is an erased state, that is to say containing a logic "1", no operation will be carried out in a memory cell to write therein a data having a logic value "1".

On the other hand, an operation for programming a memory cell will be carried out in the case where the data to be written in this cell is a "0".

The voltages to be applied on the bit line, the substrate, the control gate and the word line to select and programme a cell have been indicated above.

Likewise, the voltages to be applied on the bit line, the control gate and the word line to select and read a cell have been indicated above.

In FIG. 7, the column decoder DECC selects, with the aid of the logic signal COL1, the two bit lines BL0 and BL1.

Moreover, the gate control line CGL1 is selected.

Therefore, the data D0 is written both in the memory cell M1,0 and in the memory cell M1,1.

Then, as illustrated in FIG. 8, the column decoder selects the two bit lines BL1 and BL2 with the aid of the logic signal COL12.

Moreover, this time the gate control line CGL0 is selected.

Consequently, the second data D1 of the information is simultaneously stored in the two memory cells M0,2 and M0,3 of the first line L0.

The write operation subsequently continues sequentially until the last data D31 of the information has been written in the memory cell M0,31.

This is carried out by selecting the bit line BL31 by means of the logic signal COL31 and by selecting the gate control line CGL0 (FIG. 9).

At the end of this write operation, it is obtained, as illustrated in FIG. 10, a chequered filling of the memory area such that a data, with the exception of the last data D31, is stored in two adjacent memory cells of the same line and that two successive data are respectively stored in two twin cells of the same column.

Moreover, the twin cell M0,0 of that M1,0 storing the data D0 stores the value 1 whereas the last data D31 is stored in the twin memory cell M0,31 of the memory cell M1,31 storing the data $D_{30}$.

Reference is now made more particularly to FIGS. 11 to 18 to illustrate an example of reading of the information stored in the memory area ZM.

Since the zero voltage (ground GND) is applied during reading on the control gates of all of the memory cells of the memory area, the reading of a first twin memory cell of a column simultaneously results in the reading of the second twin cell.

Yet, if the first twin cell contains a logic "1", then this logic "1" will mask the value read of the data located in the second twin cell.

Indeed, the reading of these two twin cells will always give a logic "1" regardless of the value of the stored data.

This is the reason why it is necessary, before reading a memory cell, to replace the value stored in its twin cell with a reference bit chosen so as to make it possible to correctly restore the stored data. In this instance, this reference bit will have the value "0" which corresponds to a prior programming of the twin cell so as to store therein a "0".

This is illustrated in FIG. 11.

More specifically, with the aid of the logic signal COL0, the bit line BL0 is selected and, with the aid of the line control signal CGL0, the memory cell M0,0 is programmed so as to store therein a logic "0".

Then, the reading of the two twin cells M0,0 may be carried out so as to store therein a logic "0".

Then, the reading of the two twin cells M0,0 and M1,0 may be carried out always by selecting the bit line BL0 with the aid of the logic signal COL0, as illustrated in FIG. 12.

In addition, this time, the data D0 is read correctly.

Indeed, if the data D0 is equal to 0, then the value 0 will be effectively read by the read amplifier AMP circuit.

In addition, if the logic value of the data D0 is equal to 1, then a logic "1" will be read by the read amplifier AMP circuit.

Subsequently, as illustrated in FIGS. 13 and 14 the reading of the data D1 will be carried out.

In addition, as this time the column decoder will select the two bit lines BL0 and BL1 simultaneously, and the zero voltage GND is applied on the state transistor control gates of all of the memory cells, there will be a simultaneous reading of two twin cells located on the column "0" and of two twin cells located on the column "1".

In addition, so as to obtain a correct restoration of the logic value of the data D1, it is necessary, before reading this data D1, not only to programme the twin cell of the cell D1 with the value "0" but also to programme the cell that included the previously read data Do.

This is illustrated in FIG. 13.

It can be seen that in this prior programming step, due to the selection of bit lines BL0 and BL1 by the logic signal COL01 and due to the application of the programming voltage on the gate control line CGLi, the memory cells M1,0 and M1,1 are programmed with the logic value "0".

Therefore, as illustrated in FIG. 14, the selection of two bit lines BL0 and BL1 and the application of the zero voltage GND on the control gates of the state transistors lead to simultaneously reading the logic value of the data D1 and the three logic values "0" stored in the memory cells M0,0, M1,0 and M1,1.

Therefore, the logic value of the data D1 is restored correctly. Indeed, if this data is equal to 0, then the read amplifier circuit will effectively read a "0" whereas if this logic value is equal to 1, the read amplifier circuit will effectively read a "1".

Therefore, it should be noted here that not only does the prior programming make it possible to carry out a correct restoration of the data to be read but that this prior programming also destroys the data that has been previously read.

FIGS. 15 and 16 illustrate the reading of the following data D2.

Prior to this reading, a programming of the cells M0,1 and M0,2 (FIG. 15) then a reading of the data D2 stored in the memory cell M1,2 (FIG. 16) are carried out.

The data D1 has therefore been destroyed.

FIGS. 17 and 18 illustrate the reading of the last data D31.

In this regard, as illustrated in FIG. 17, a prior programming of the twin cell M1,31 then as illustrated in FIG. 18 a reading of the cell D31 stored in the memory cell M0,31 are carried out.

At the end of this reading, it is noted that all of the memory cells with the exception of the last cell M0,31, store a logic 0.

The reading of N binary data of the stored information has therefore destroyed all of the bits of this information with the exception of the last.

In addition, it is therefore no longer possible to read this information again.

Here, the memory device therefore includes a memory readable only once.

If it is desired to offer a memory device that can be read a predetermined number of times, for example K times, then it is possible, as illustrated schematically in FIG. 19, to provide a memory plane PM including K areas ZM, ZM1-ZMK.

These areas will be read successively as indicated above for the area ZM, so as to make it possible to read the information only K times.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A non-volatile memory device comprising:
a memory plane including at least one memory area including an array of memory cells having two rows and N columns,
wherein each memory cell comprises a state transistor having a control gate and a floating gate selectable by a vertical selection transistor buried in a substrate and including a buried selection gate, and
wherein each column of memory cells includes a pair of twin memory cells, two selection transistors of the pair of twin memory cells having a common selection gate; and
a processing device configured to store information in the memory area including a succession of N bits so that, with exception of the last bit of the succession, a current bit of the succession is stored in two memory cells located on the same row and on two adjacent columns and the current bit and a following bit are respectively stored in two twin cells so that a chequered filling of the memory area is obtainable.

2. The device according to claim 1, wherein the processing device is configured to, in order to be able to read a bit stored in a first twin cell, replace beforehand a bit stored in a second twin cell with a reference bit having a reference value chosen to make possible a correct restoration of the value of the bit stored in the first twin cell.

3. The device according to claim 2, wherein the processing device is further configured to sequentially read the N bits of the information and replace an already read current bit of the information with the reference bit before being able to read the following bit of the succession.

4. The device according to claim 1, wherein the memory area includes one single bit line per column, connected to drains of the state transistors of the pair of twin cells of a corresponding column, and one gate control line, per row of memory cells, connected to all of the control gates of the state transistors of the memory cells of a corresponding row.

5. The device according to claim 1, wherein the processing device comprises a column decoder configured to individually select two bit lines associated with the two columns located at the two ends of the memory area and, to simultaneously select two adjacent bits, for storing the information as well as for reading and of replacing beforehand the bits.

6. The device according to claim 1, wherein each memory cell has a first state in which it stores a bit having a first logic value and a second state in which it stores a bit having a second logic value, and wherein a reference bit has the second logic value.

7. The device according to claim 6, wherein the state transistor of the memory cell is configured to be normally on when the memory cell is in the first state and to be turned off when the memory cell is in its second state.

8. The device according to claim 7, wherein the state transistor is of a depletion type, wherein the state transistor has, in the first state of the memory cell, a negative threshold voltage and a lower voltage than the threshold voltage of the state transistor of the memory cell at a virgin state, and wherein the state transistor has, in the second state of the memory cell, a positive threshold voltage and a higher voltage than the threshold voltage of the state transistor of the memory cell at the virgin state.

9. The device according to claim 8, wherein the processing device is configured to apply a zero read voltage on the control gate of the state transistor of the memory cell during a read operation of the memory cell.

10. The device according to claim 8, wherein the first state of the memory cell corresponds to an erased state of the cell and the first logic value is a 1, the second state of the memory cell corresponds to a programmed state of the cell and the second logic value is a 0.

11. The device according to claim 10, wherein all of the memory cells of the memory area are in the erased state before storing the information in the memory area.

12. The device according to claim 1, further comprising a plurality of memory areas configured to contain the same information of N bits, and wherein the processing device is configured to successively read various memory areas.

13. A method for storing information including a succession of N bits in a non-volatile memory device, wherein the device comprises a memory plane including at least one memory area including an array of memory cells having two rows and N columns, each memory cell comprising a state transistor having a control gate and a floating gate, selectable by a vertical selection transistor buried in a substrate and including a buried selection gate, each column of memory cells including a pair of twin memory cells, two selection transistors of the pair of twin memory cells having a common selection gate, the method comprising:
storing N bits so that, with exception of the last bit of the succession, a current bit of the succession is stored in two memory cells located on the same row and on two adjacent columns and so that the current bit and a following bit are respectively stored in two twin cells so that a chequered filling of the memory area is obtained.

14. The method according to claim 13, further comprising replacing, before reading a bit stored in a first twin cell, the bit stored in a second twin cell with a reference bit having a reference value chosen so that a correct restoration of the value of the bit stored in the first twin cell is possible.

15. The method according to claim 14, further comprising sequentially reading the N bits and replacing an already read current bit of the succession with the reference bit before being able to read the following bit of the succession.

16. The method according to claim 14, further comprising applying a zero read voltage on the control gate of the state transistor of the memory cell while reading the memory cell.

17. The method according to claim 13, further comprising individually selecting two bit lines associated with the two columns located at the two ends of the memory area, and simultaneously selecting two adjacent bits, for storing the information as well as for reading and of replacing beforehand the bits.

18. The method according to claim 13, wherein each memory cell possesses a first state, corresponding to an erased state of the cell, in which a logic 1 is stored, and a second state, corresponding to a programmed state of the cell, in which a logic 0 is stored, and wherein the method further comprises, in order to replace an already read bit, programming two memory cells containing this already read bit.

19. The method according to claim 18, further comprising, before storing the information in the memory area, erasing all of the memory cells of the memory area.

20. The method according to claim 13, further comprising:
storing the information in a plurality of memory areas; and
successively reading various memory areas.

* * * * *